(12) United States Patent
Kim

(10) Patent No.: US 6,770,926 B2
(45) Date of Patent: Aug. 3, 2004

(54) SEMICONDUCTOR DEVICE WITH VIA-CONTACT PLUGS

(75) Inventor: Kil Ho Kim, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/225,118

(22) Filed: Aug. 22, 2002

(65) Prior Publication Data

US 2003/0075747 A1 Apr. 24, 2003

(30) Foreign Application Priority Data

Oct. 19, 2001 (KR) .......................................... 2001-64700

(51) Int. Cl.⁷ ...................... H01L 27/108; H01L 29/76; H01L 29/94; H01L 31/119
(52) U.S. Cl. ..................... 257/296; 257/303; 257/306
(58) Field of Search ................................ 257/296, 300, 257/303, 306, 532; 438/239, 244, 250, 253, 393, 396

(56) References Cited

U.S. PATENT DOCUMENTS 6,246,084 B1 * 6/2001 Kim
6,492,223 B2 * 12/2002 Kanamori et al.

FOREIGN PATENT DOCUMENTS

JP 9-260485 10/1997
JP 10178159 A * 6/1998

OTHER PUBLICATIONS

Notice of Rejection from the Korean Intellectual Property Office dated Aug. 29, 2003, 2 pages, with English translation (2 pages).

* cited by examiner

Primary Examiner—Wael Fahmy, Jr.
Assistant Examiner—Hoai Pham
(74) Attorney, Agent, or Firm—Finnegan, Henderson, Farabow, Garrett & Dunner, L.L.P.

(57) ABSTRACT

The present invention relates to a semiconductor device and a method of fabricating the same for simplifying a fabrication process of the semiconductor device and enhancing the performance and yield of the device. A first metal wiring on a semiconductor substrate serves as a first electrode of a metal-insulator-metal (MIM) capacitor. A dielectric film pattern is formed on the first metal wiring. A first via-contact plug on the dielectric film pattern contacts a side of the first metal wiring. An interlayer insulation film is formed having second via-contact plugs in a parallel array structure. The second via-contact plugs contact the dielectric film pattern and serve as a second electrode of the MIM capacitor. A second metal wiring is formed on the interlayer insulation film to contact the first via-contact plug and the second via-contact plugs.

4 Claims, 10 Drawing Sheets

SEMICONDUCTOR DEVICE WITH VIA-CONTACT PLUGS

BACKGROUND OF THE INVENTION

1. Field of the Invention

The present invention relates to a semiconductor device and a method of fabricating the same. In particular, the present invention relates to a capacitor in a semiconductor device and a method of manufacturing the same.

2. Description of the Related Art

In typical semiconductor manufacturing processes, a capacitor within a semiconductor device is manufactured using polysilicon as an electrode material. In general, a Metal-Insulator-Metal (MIM) capacitor comprises a first polysilicon layer, a second polysilicon layer, and a number of metal wiring layers. However, MIM capacitors with a large capacitance require metal wiring layers having a large area.

FIGS. 1A through 1J are sectional views illustrating a conventional method of fabricating a MIM capacitor of a semiconductor device. As shown in FIG. 1A, a first interlayer insulation film 13 is formed on a semiconductor substrate 11. A first Ti/TiN layer 15 is formed on the first interlayer insulation film 13 at a thickness of 200 to 600 Å. The Ti portion of the first Ti/TiN layer 15 is used as an adhesive layer, and the TiN portion is used as a diffusion preventing film. A first Al layer 17 is formed on the first Ti/TiN layer 15 at a thickness of 4000 to 5000 Å. A second Ti/TiN film 19 is then formed on the first Al layer 17 at a thickness of 300 to 700 Å. The Ti layer of the second Ti/TiN layer 19 is used as an adhesive layer, and the TiN layer is used as an anti-reflection film. A dielectric film 21 is formed on the second Ti/TiN layer 19 at a thickness of 500 to 1500 Å. The dielectric film 21 is made of $SiO_xN_y$, $Si_3N_4$ or an oxide formed by a plasma enhanced chemical vapor deposition ("PECVD") method. An upper-electrode thin film 23 is formed on the dielectric film 21 at a thickness of 1000 to 3000 Å. The upper-electrode thin film 23 is formed using an Al layer, a Ti/TiN layer or a stacked structure of Al and Ti/TiN layers.

Referring now to FIG. 1B, a first photosensitive film pattern 25 is formed on the upper-electrode thin film 23 to expose a predetermined portion for an upper electrode. Referring now to FIG. 1C, an upper electrode 24 and a dielectric film pattern 22 is formed by etching the upper-electrode thin film 23 and the dielectric film 21 using the first photosensitive film pattern 25 as an etching mask. The upper-electrode thin film 23 is etched in a dry-etching process using plasma activated by a mixture gas of $Cl_2/BCl_3$ as a primary etching gas and $N_2$ gas as an additive gas. The dielectric film 21 is etched using a dry-etching process using plasma activated by a CxFy gas as a primary etching gas and $CHF_3$, $O_2$ or Ar as an additive gas. The first photosensitive film pattern 25 is then removed.

Referring now to FIG. 1D, a second photosensitive film pattern 27 which protects a predetermined portion for a lower metal wiring is formed on the entire surface. A lower metal wiring having a stacked structure of the second Ti/TiN layer pattern 20, the first Al layer pattern 18 and the first Ti/TiN layer pattern 16 is formed by etching the second Ti/TiN layer 19, the first Al layer 17 and the first Ti/TiN layer 15 using the second photosensitive film pattern 27 as an etching mask. The etching is carried out using a dry-etching process using plasma activated by a mixture gas of $Cl_2/BCl_3$ as a primary etching gas and $N_2$ gas as an additive gas.

Referring now to FIG. 1E, the second photosensitive film pattern 27 is then removed. Referring now to FIG. 1F, a second interlayer insulation film 29 is formed on the entire surface. The second interlayer insulation film 29 is formed of $SiO_2$, $SiO_{2-\delta}$, Spin-On-Glass (SOG) or Flowable Oxide (FOx). A Chemical Mechanical Polishing (CMP) is used to planarize and adjust the thickness of the second interlayer insulation film 29.

Referring now to FIG. 1G, a third photosensitive film pattern 31 is formed on the second interlayer insulation film 29 to expose predetermined portions for via-contacts. Referring now to FIG. 1H, via-contact holes 33a–33c are formed by etching the second interlayer insulation film 29 using the third photosensitive film pattern 31 as an etching mask. The etching is carried out using a dry-etching process using plasma activated by a $C_xF_y$ gas. If the etching is excessive, the entire upper layer 24 may be etched. The third photosensitive film pattern 31 is then removed.

Referring now to FIG. 1I, a via-contact plug 35 is formed by depositing a tungsten layer on the entire surface and performing a CMP process or an etch-back process using plasma. The via-contact plug 35 is connected to the upper electrode 24.

Referring now to FIG. 1J, an upper metal wiring having a stacked structure comprising a fourth Ti/TiN layer pattern 41, a second Al layer pattern 39 and a third Ti/TiN layer pattern 37 is formed by sequentially forming and then etching a third Ti/TiN layer (not shown), a second Al layer (not shown) and a fourth Ti/TiN layer (not shown) on the entire surface using an upper metal wiring mask as an etching mask. Accordingly, a MIM capacitor 43 is formed as indicated by the area surrounded by the dotted line.

Unfortunately, the conventional method of fabricating the MIM capacitor and the semiconductor device has several disadvantages. The stepped structure due to the dielectric film pattern and the upper electrode makes it difficult to use a fine pattern when forming the photosensitive film pattern for the lower metal pattern. A separate mask process and etching process is required to form the upper electrode, which also complicates the manufacturing process. In addition, a considerable amount of the upper electrode is lost due to the depth difference between the via-contact holes formed on the upper electrode and the via-contact holes formed on the lower metal electrode, which deteriorates the operational characteristics and process yield of the device.

It is, therefore, desired to provide a semiconductor device and a method of fabricating the same that address the above and other shortcomings of the prior art.

SUMMARY OF THE INVENTION

In accordance with an aspect of the invention, a semiconductor device comprises: a first metal wiring on a semiconductor substrate serving as a first electrode of a metal-insulator-metal (MIM) capacitor; a dielectric film pattern on the first metal wiring; a first via-contact plug on the dielectric film pattern contacting a side of the first metal wiring; an interlayer insulation film having second via-contact plugs in a parallel array structure, the second via-contact plugs contacting the dielectric film pattern and serving as a second electrode of the MIM capacitor; and a second metal wiring formed on the interlayer insulation film to contact the first via-contact plug and the second via-contact plugs.

In accordance with another aspect of the invention, a method of fabricating a semiconductor device, comprises: forming a first metal wiring on a semiconductor substrate and a dielectric film pattern on the first metal wiring; forming a stacked structure comprising a first interlayer insulation film and a second interlayer insulation film; forming a photosensitive film pattern defining a first via-contact region and second via-contact regions on the stacked structure, wherein the photosensitive film pattern exposes the first via-contact region at first side of the first metal wiring, defines the second via-contact regions in a parallel array structure at a second side of the first metal wiring, and defines a width of each of the second via-contact regions smaller than a width of the first via-contact region; etching the first and second interlayer insulation films and the dielectric film pattern on the first metal wiring using the photosensitive film pattern as an etching mask to form a first via-contact hole exposing the first metal wiring and second via-contact holes exposing the dielectric film pattern; removing the photosensitive film pattern; filling the first and second via-contact holes to form a first contact-plug and second via-contact plugs, the second via-contact plugs serving as a second electrode of the MIM capacitor; and forming a second metal wiring contacting the first via-contact plug and the second via-contact plugs.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

In the Figures.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

A semiconductor device and a method of fabricating the same uses via-contact holes arrayed in parallel, a micro-loading effect, an etch-stop effect based upon the ingredients of plasma components, and via-contact plugs filling the via-contact holes as an electrode of the MIM capacitor.

A micro-loading effect is used to account for the width of the via-contact hole. An etch-stop effect is used to account for a C/F or C/O ratio in the plasma used as an etching gas to form the first via-contact hole contacting the lower metal wiring and the second via-contact holes having the parallel array structure. The first via-contact hole and the second via-contact holes are filled to form the first via-contact plug and the second via-contact plugs. The second via-contact plugs are used as an electrode of the MIM capacitor. The contact etching is performed such that the width of the first via-contact plug is larger than the width of the second via-contact plugs.

Figure 1A:
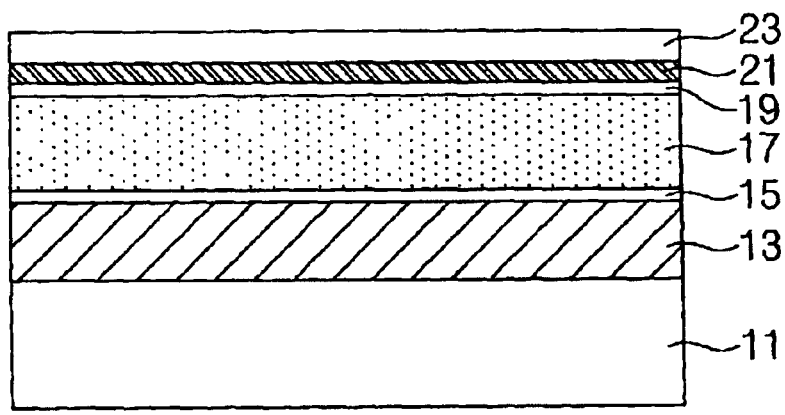
FIGS. 1A through 1J are sectional views illustrating a conventional method of fabricating a semiconductor device.
Figure 1B:
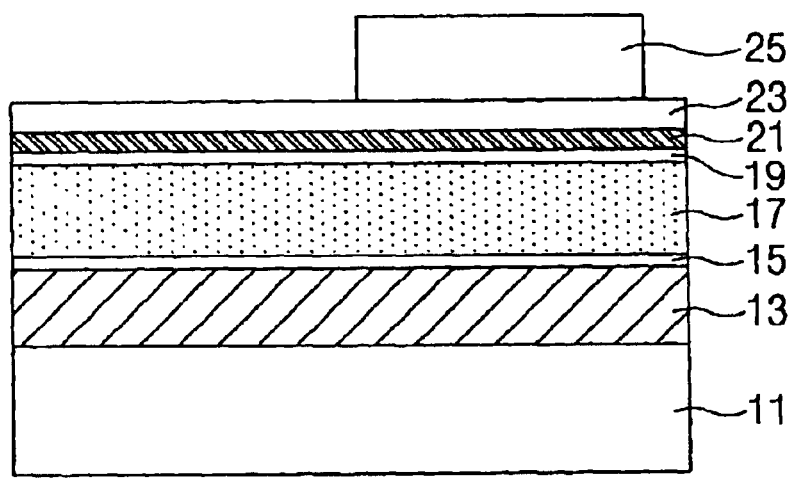
Figure 1C:
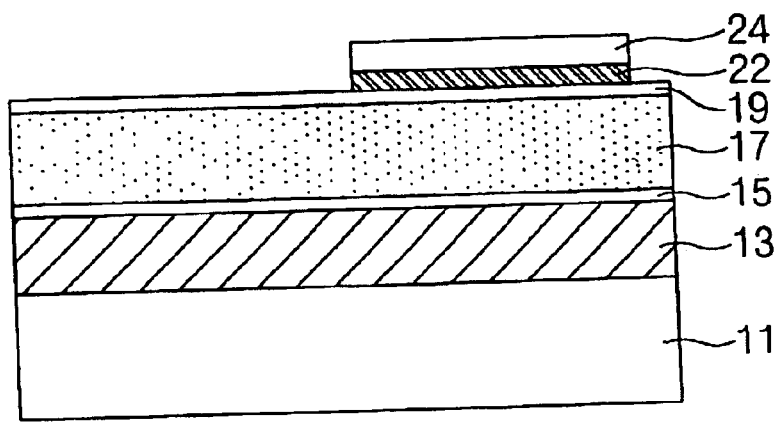
Figure 1D:
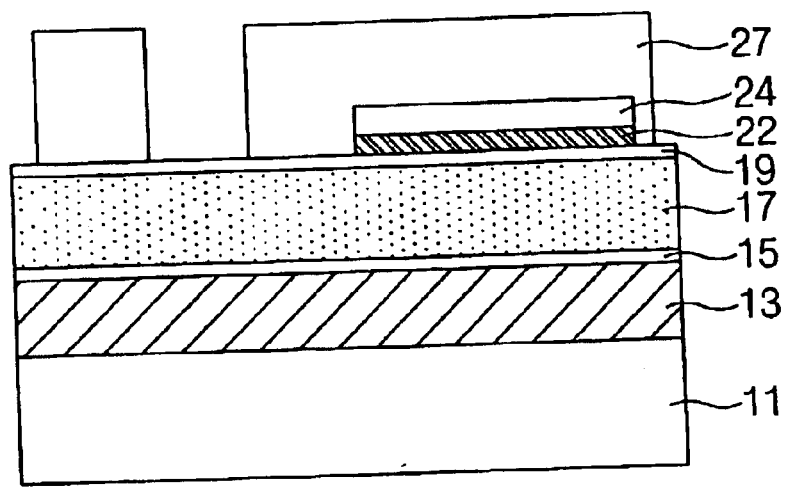
Figure 1E:
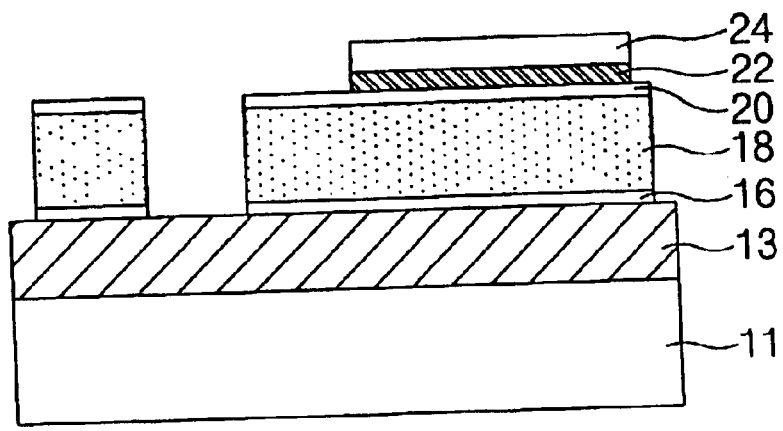
Figure 1F:
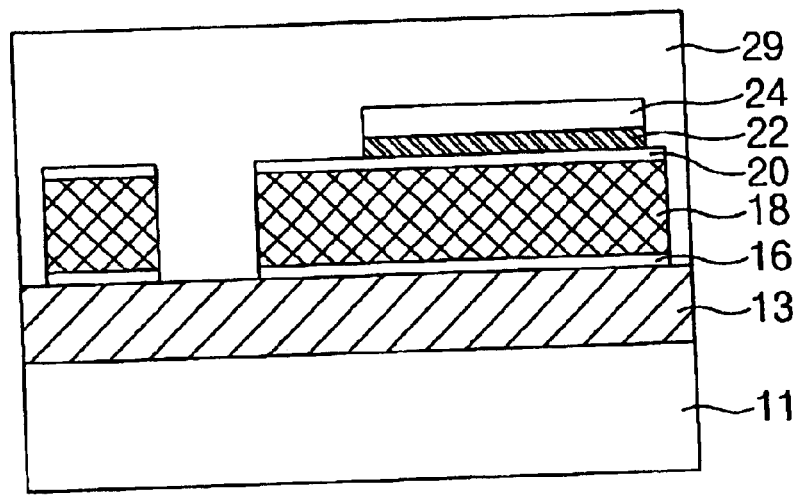
Figure 1G:
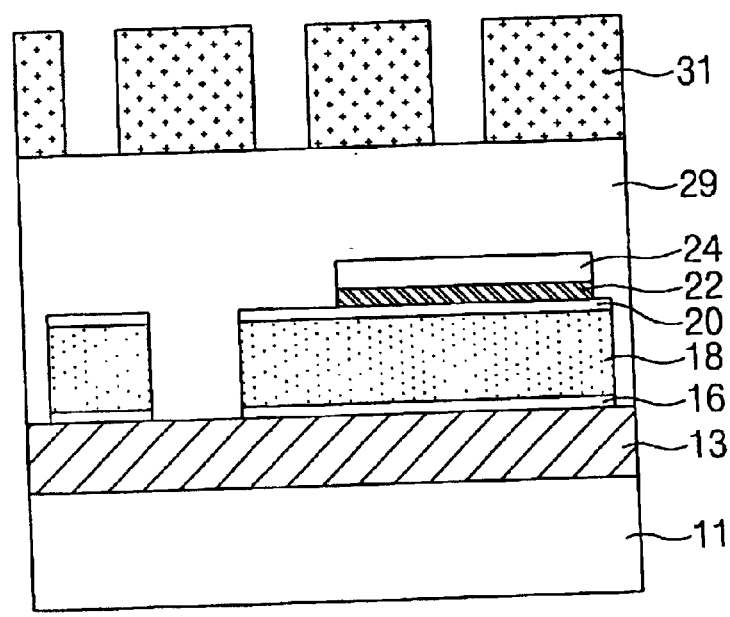
Figure 1H:
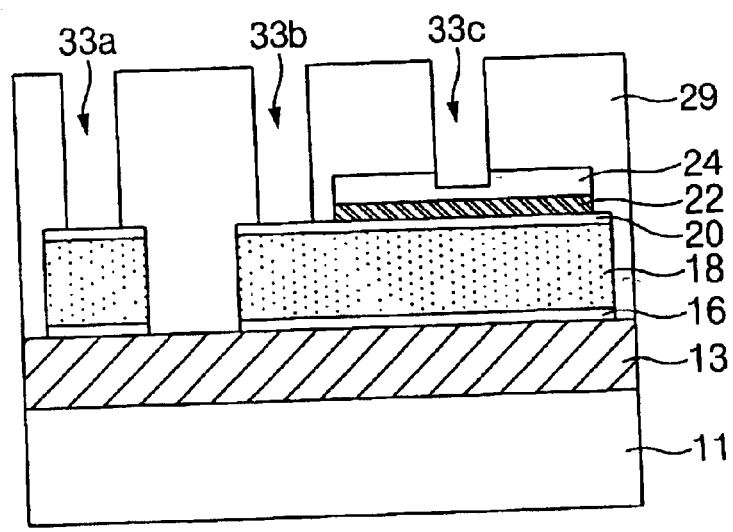
Figure 1I:
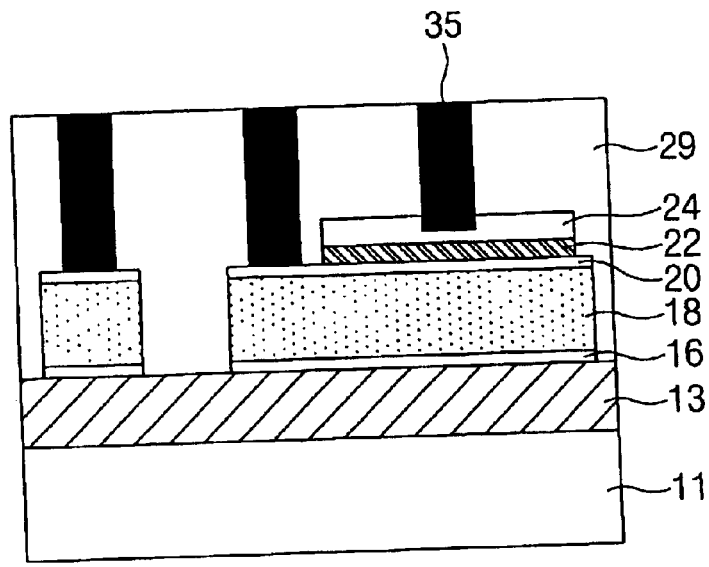
Figure 1J:
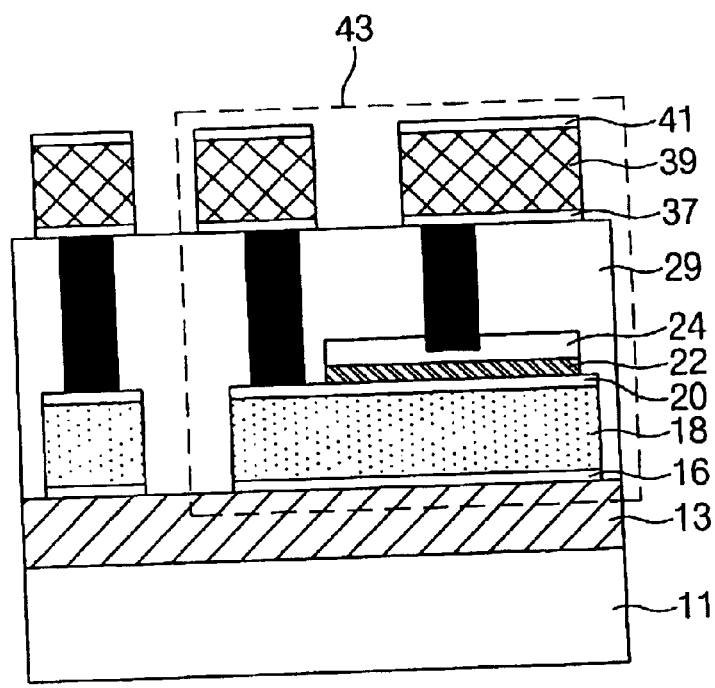
Figure 2A:
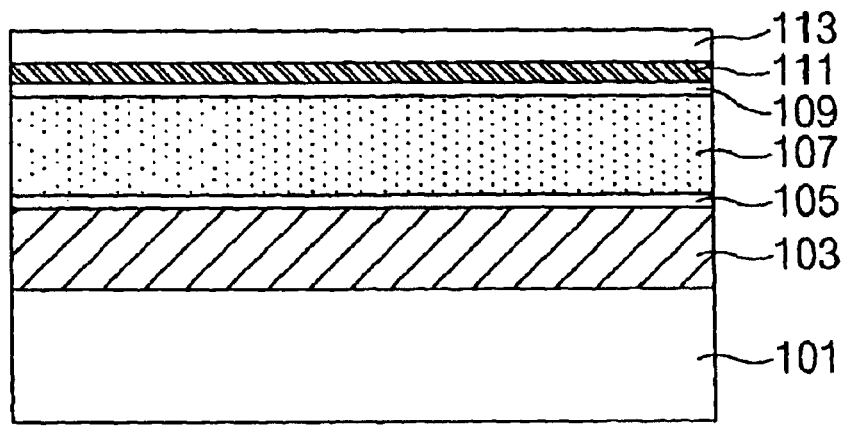
FIGS. 2A through 2I are sectional views illustrating a method of fabricating a MIM capacitor of a semiconductor device, consistent with the principles of the present invention.

FIGS. 2A to 2I are sectional views illustrating a method of fabricating a semiconductor device, consistent with the principles of the present invention. Referring now to FIG. 2A, a first interlayer insulation film 103 is formed on a semiconductor substrate 101. A first Ti/TiN layer 105 is formed on the first interlayer insulation film 103, for example, at a thickness of about 200 to 600 Å. The Ti portion of the first Ti/TiN layer 105 may be used as an adhesive layer, and the TiN portion of the first Ti/TiN layer 105 may be used as a diffusion preventing film.

A first Al layer 107 is formed on the first Ti/TiN layer 105, for example, at a thickness of about 4000 to 5000 Å. A second Ti/TiN layer 109 is formed on the first Al layer 107, for example, at a thickness of about 300 to 700 Å. The Ti portion of the second Ti/TiN layer 109 may be used as an adhesive layer, and the TiN portion of the second Ti/TiN layer 109 may be used as an anti-reflection film. A first dielectric film 111 and a second dielectric film 113 are formed sequentially on the second Ti/TiN layer 109. The first dielectric film 111 is formed using an $SiO_xN_y$ film and the second dielectric film 113 is formed using an $Si_3N_4$ film. The first and the second dielectric films 111 and 113 may form a stacked structure and, for example, have a thickness of about 700 to 1300 Å. The first and the second dielectric films 111 and 113 may also be used as a hard mask in a patterning process for the lower metal wiring.

Figure 2B:
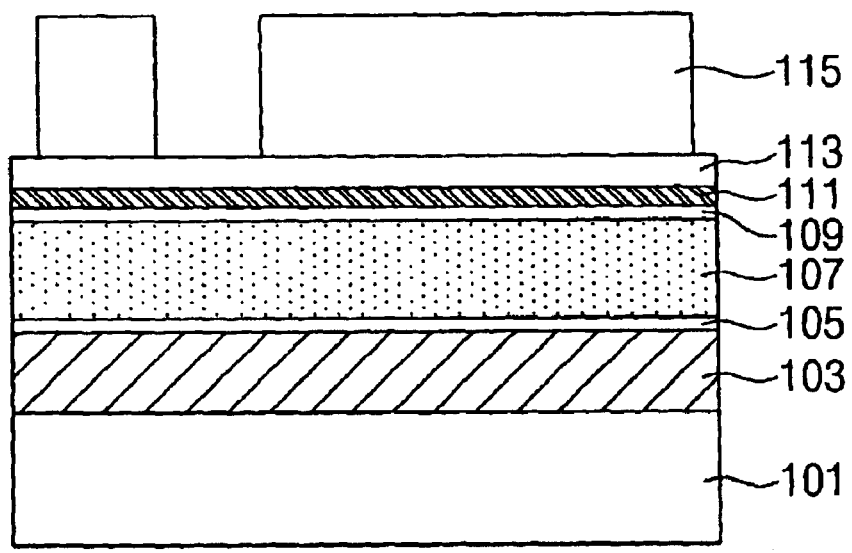

Referring now to FIG. 2B, exposure and development are carried out using a lower metal wiring mask on a dielectric film (not shown) to form a first photosensitive film pattern 115. The first photosensitive film pattern 115 is used as an etching mask to sequentially etch the second dielectric film 113, the first dielectric film 111, the second Ti/TiN layer 109, the first Al layer 107 and the first Ti/TiN layer 105. The second dielectric film 113 and the first dielectric film 111 are etched using plasma activated by a $C_xF_y$ gas. The second Ti/TiN layer 109, the first Al layer 107 and the first Ti/TiN layer 105 are etched using plasma activated by a mixture gas using a primary etching gas, such as $Cl_2/BCl_3$.

Figure 2C:
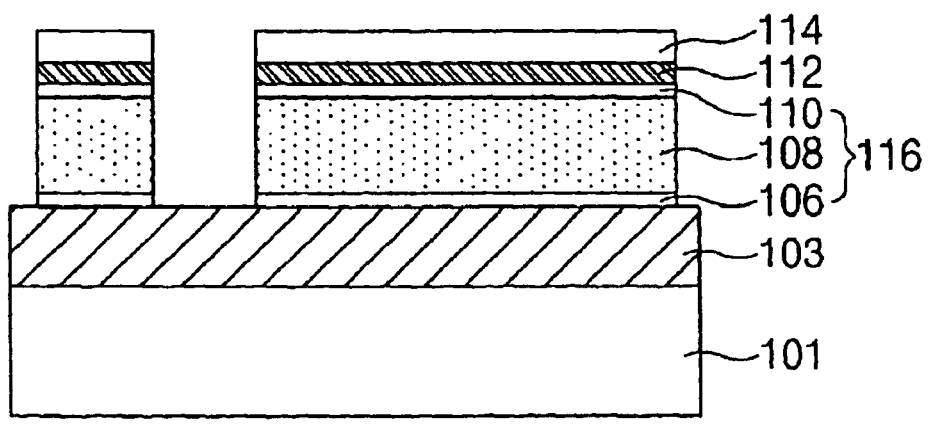

Referring now to FIG. 2C, a second dielectric film pattern 114, a first dielectric film pattern 112, and a stacked structure 116 are formed using the first photosensitive film pattern 115 as an etching mask. The stacked structure 116 comprises a second Ti/TiN layer pattern 110, a first Al layer pattern 108 and a first Ti/TiN layer pattern 106.

The second dielectric film pattern 114 and the first dielectric film pattern 112 are used as a hard mask in the etching process. Accordingly, the thickness of the first photosensitive film pattern 115, for example, can be reduced and enable a finer pattern for the stacked structure 116. The first Al layer pattern 108 is used as a lower electrode of the MIM capacitor. The first photosensitive film pattern 115 is then removed.

Figure 2D:
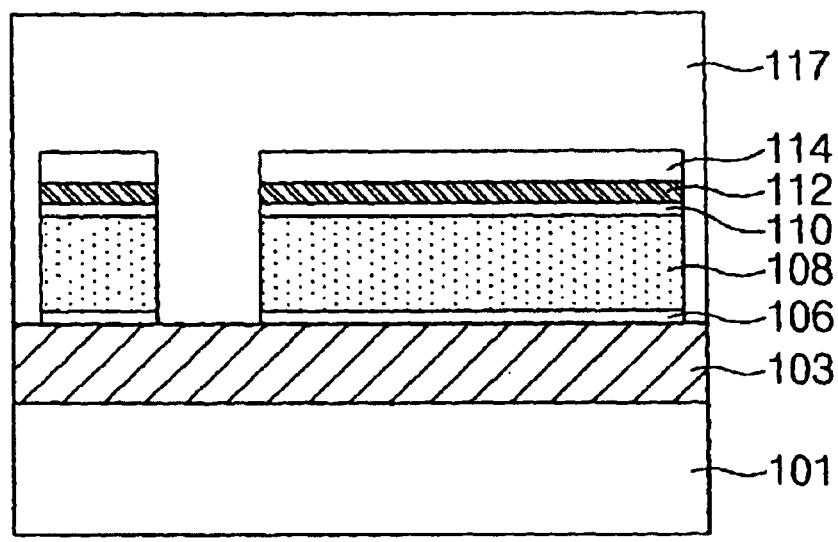

Referring now to FIG. 2D, a second interlayer insulation film 117 is formed on the entire surface. The second interlayer insulation film 117 is formed using an $SiO_2$ film, an $SiO_{2-\delta}$ film, an SOG film or a flowable oxide ("FOx"). The $SiO_{2-\delta}$ film contains less oxygen than the $SiO_2$ film. A CMP is used to planarize and adjust the thickness of the second interlayer insulation film 117.

Figure 2E:
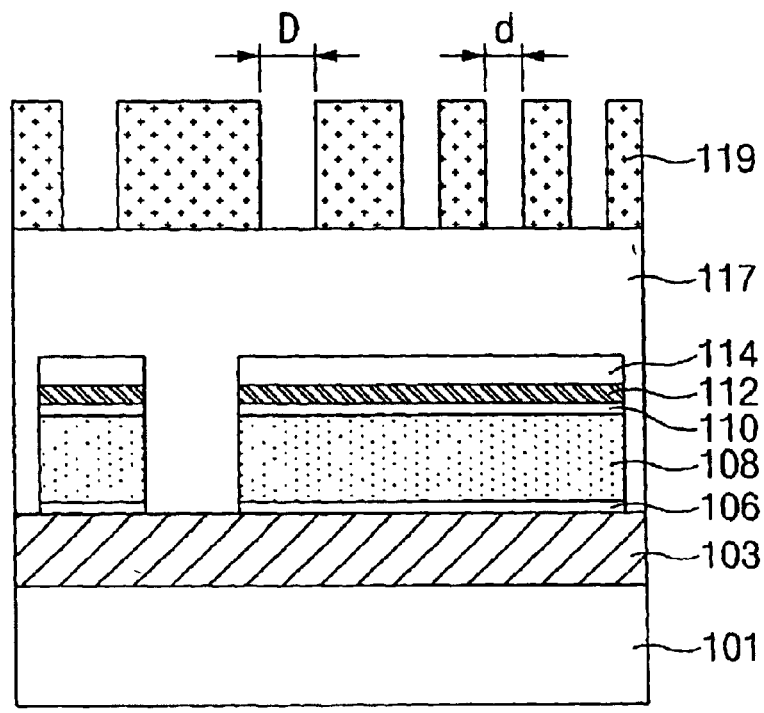

Referring now to FIG. 2E, a second photosensitive film pattern 119 is formed on the second interlayer insulation film 117. Predetermined portions of the second interlayer insulation film 117 are exposed for via-contacts. The second photosensitive film pattern 119 defines one or more first via-contact regions having a width D, for example, based on a design rule. The second photosensitive film pattern 119 may also define a plurality of second via-contact regions having a width d and arranged in a parallel array structure. The second via-contact regions may be formed to have a width d that is smaller than the width D of the first via-contact region. The second via-contact regions may form an upper electrode region of the MIM capacitor. In one embodiment, the second via-contact regions are formed as close to each other as possible.

Figure 2F:
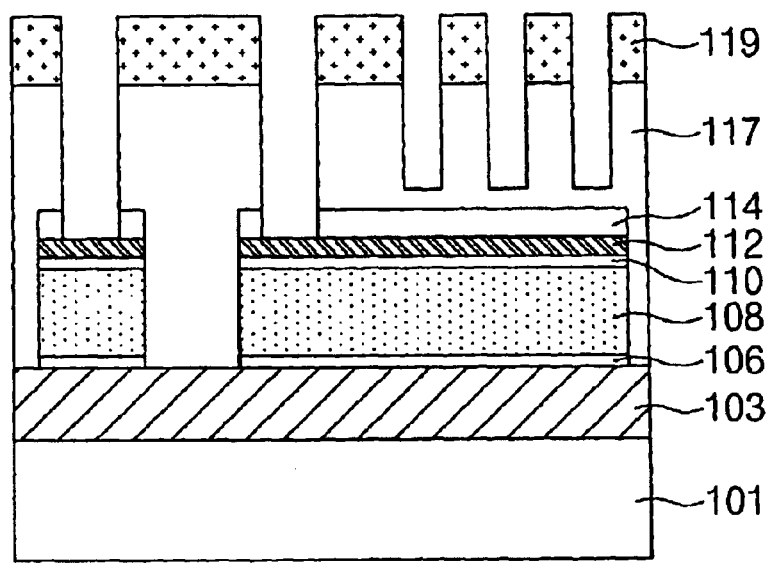

Referring now to FIG. 2F, the second interlayer insulation film 117 is etched using the second photosensitive film pattern 119 as an etching mask. A first stage of etching is carried out to expose the first dielectric film pattern 112 using a plasma activated by a $C_xF_y$ gas. The plasma activation parameters of the plasma are adjusted so that an etch-stop phenomenon does not occur in the second interlayer insulation film 117, the second dielectric film pattern 114 and the first dielectricfilm pattern 112. The second dielectric film pattern 114 of the upper electrode region may then be exposed.

A second stage etching is then carried out to expose the second Ti/TiN layer pattern 110 using an activated plasma having a C/F ratio or C/O ratio adjusted to be higher than that of the first etching stage. With these parameters, an etch-stop phenomenon may be prevented from occurring in the second interlayer insulation film 117 and the first dielectric film pattern 112 while an etch-stop phenomenon occurs in the second dielectric film pattern 114.

The etching may be performed using the following reaction processes. Reaction process 1 indicates the reaction process used to etch the second interlayer insulation film 117. Reaction process 2 indicates the reaction process used to etch the first dielectric film pattern 112. Reaction process 3 indicates the reaction process used to etch the second dielectric insulation film 114. In the following reaction processes, a "*" denotes a state that the corresponding component is activated to readily react with other materials, and a "↑" denotes a volatile material.

Reaction Process 1:

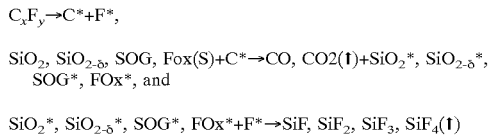

Reaction Process 2:

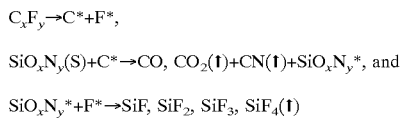

Reaction Process 3:

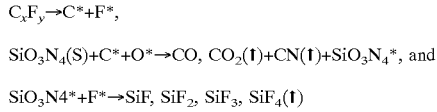

In the above reaction processes, oxygen ($O/O_2$) may be sufficiently supplied to remove carbon so that the etching may be carried out smoothly. In addition, oxygen may be added to prevent carbon from being readily removed and, thus, allowing the carbon in the plasma to be stacked on an etched layer in the form of a polymer to block etching by a fluorine (F) component.

Figure 2G:
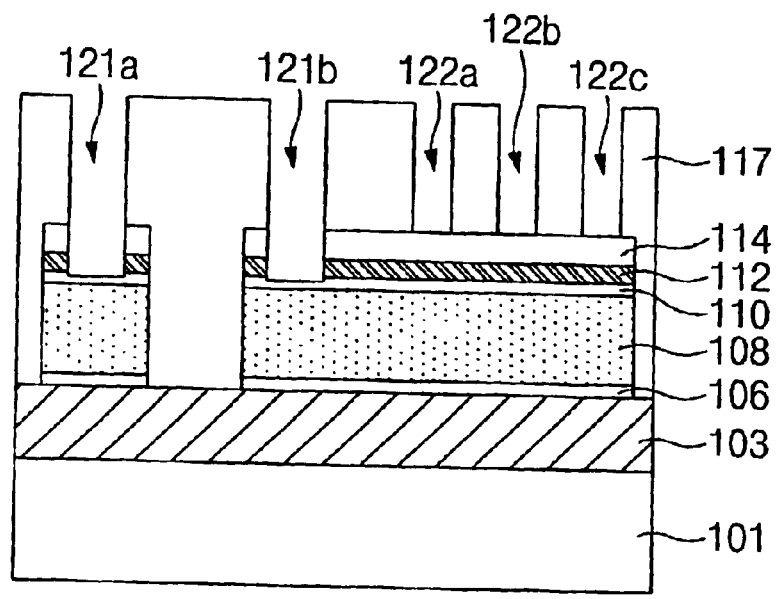

Referring now to FIG. 2G, first via-contact holes 121a and 121b and second via-contact holes 122a, 122b, and 122c are formed and the second photosensitive film pattern 119 is removed. The first via-contact holes 121a and 121b are formed by etching the first insulation film pattern 112 and the second dielectric film pattern 114 to expose the second Ti/TiN layer pattern 110. The second via-contact holes 122a, 122b, and 122c are formed to expose the second dielectric film pattern 114.

Figure 2H:
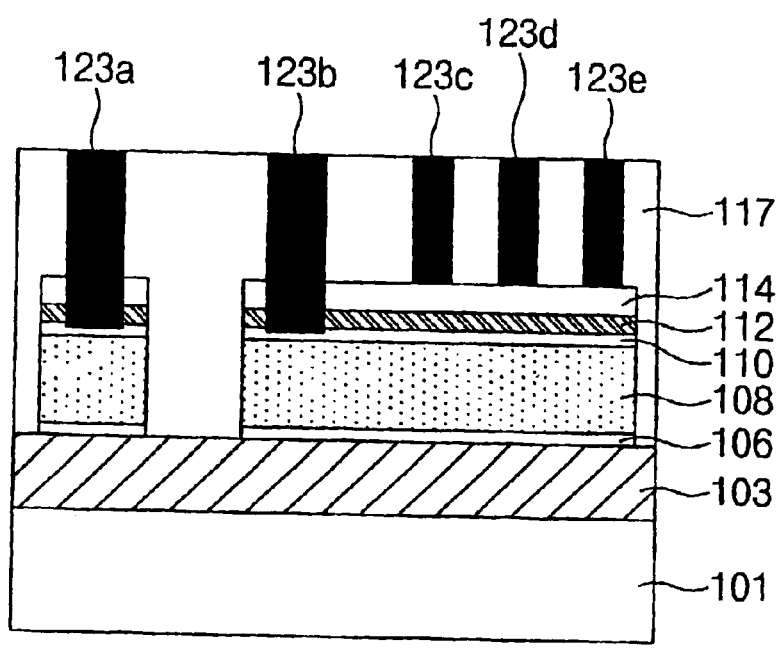

Referring now to FIG. 2H, via-contact plugs 123a–123e are formed to fill the first via-contact holes 121a and 121b and the second via-contact holes 122a, 122b, and 122c by depositing a tungsten ("W") layer on the entire surface. A CMP process or etch-back process using plasma may then be used. In one embodiment, the via-contact plugs 123c, 123d, and 123e may be used as an upper electrode of the MIM capacitor. A third Ti/TiN layer (not shown), a second Al layer (not shown) and a fourth Ti/TiN layer (not shown) are sequentially formed on the entire surface.

Figure 2I:
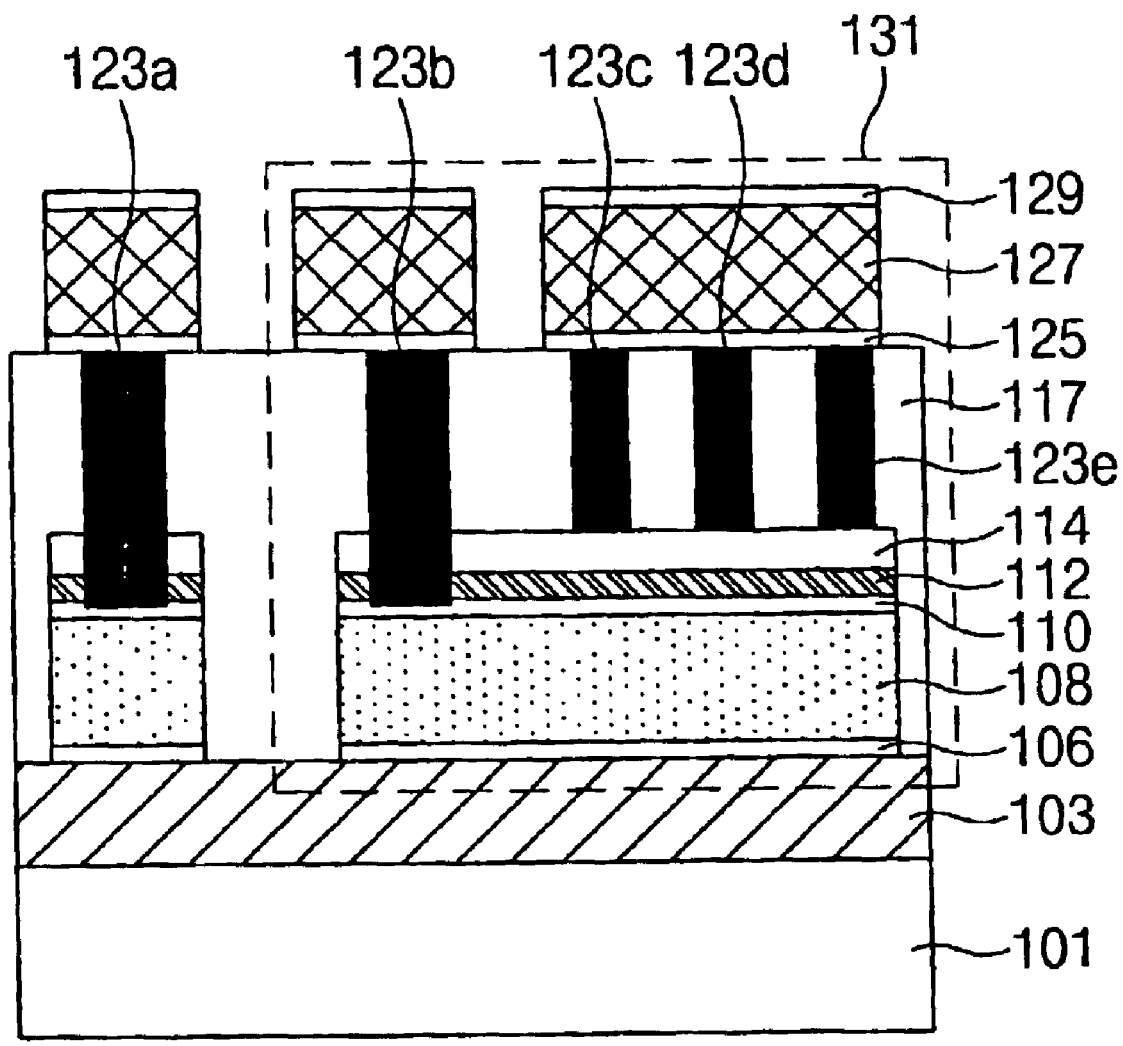

Referring now to FIG. 2I, photolithography is carried out using an upper metal wiring mask to form a stacked structure comprising a fourth Ti/TiN layer pattern 129, a second Al layer pattern 127 and a third Ti/TiN layer pattern 125. This stacked structure may then be used as an upper metal wiring for the MIM capacitor.

Accordingly, a MIM capacitor 131 is formed as indicated by the area marked with a dotted line. The first Al layer pattern 108 is used as a lower electrode. The first dielectric film pattern 112 and the second dielectric film pattern 114 are used as dielectric materials. Via-contact plugs 123c, 123d, and 123e are used as an upper electrode. Thus, a MIM capacitor in a semiconductor device may be fabricated without a separate mask process to form the upper electrode of the MIM capacitor which, for example, may improve the yield of the process. In addition, patterning of the lower metal wiring and the operational characteristics of the device may be improved.

What is claimed is:

1. A semiconductor device comprising:
    a first metal wiring on a semiconductor substrate serving as a first electrode of a metal-insulator-metal (MIM) capacitor;
    a dielectric film pattern on the first metal wiring;
    a first via-contact plug on the dielectric film pattern contacting the first metal wiring;
    an interlayer insulation film having a plurality of second via-contact plugs in a parallel array structure, the plurality of second via-contact plugs contacting the dielectric film pattern and serving as a second electrode of the MIM capacitor, wherein a width of the first via-contact plug is greater than a width of the plurality or second via-contact plugs; and
    a second metal wiring formed on the interlayer insulation film to contact the first via-contact plug and the plurality of second via-contact plugs.

2. The semiconductor device in accordance with claim 1, wherein the dielectric film pattern comprises a stacked structure including a $SiO_xN_y$ layer and a $Si_3N_4$ layer.

3. The semiconductor device in accordance with claim 1, wherein the first metal wiring comprises a stacked structure including a Ti layer, a TiN layer, an Al layer, a TI layer, and a TIN layer.

4. The semiconductor device in accordance with claim 1, wherein the first via-contact plug and the plurality of second via-contact plugs comprise tungsten.

* * * * *